(12) United States Patent
Ishizuya (10) Patent No.: US 7,298,015 B2
(45) Date of Patent: Nov. 20, 2007

(54) THREE-DIMENSIONAL STRUCTURE ELEMENT AND METHOD OF MANUFACTURING THE ELEMENT, OPTICAL SWITCH, AND MICRO DEVICE

(75) Inventor: Tohru Ishizuya, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/523,267

(22) PCT Filed: Jul. 31, 2003

(86) PCT No.: PCT/JP03/09734

§ 371 (c)(1),
(2), (4) Date: Jan. 31, 2005

(87) PCT Pub. No.: WO2004/013037

PCT Pub. Date: Feb. 12, 2004

(65) Prior Publication Data

US 2005/0238282 A1     Oct. 27, 2005

(30) Foreign Application Priority Data

Aug. 1, 2002     (JP) .................. 2002-224530

(51) Int. Cl.
*H01L 29/82*     (2006.01)
(52) U.S. Cl. ................. 257/415; 257/98; 438/926; 438/622
(58) Field of Classification Search ............. 438/926, 438/622, 626; 257/415, 98; 385/18
See application file for complete search history.

(56) References Cited

U.S. PATENT DOCUMENTS

| | | | |
|---|---|---|---|
| 5,636,070 A | | 6/1997 | Ji et al. |
| 5,946,584 A | | 8/1999 | Ishikiriyama |
| 5,994,750 A | * | 11/1999 | Yagi ................ 257/415 |
| 6,080,988 A | | 6/2000 | Ishizuya et al. |
| 6,136,390 A | * | 10/2000 | Park et al. ........ 427/579 |
| 6,420,744 B1 | * | 7/2002 | Kim et al. ........ 257/295 |
| 6,469,301 B1 | * | 10/2002 | Suzuki et al. ..... 250/338.1 |
| 6,526,198 B1 | * | 2/2003 | Wu et al. ......... 385/18 |

(Continued)

FOREIGN PATENT DOCUMENTS

CN     1258851 A     7/2000

(Continued)

*Primary Examiner*—Mary Wilczewski
*Assistant Examiner*—Tsz Chiu
(74) *Attorney, Agent, or Firm*—Klarquist Sparkman, LLP (57) ABSTRACT

A three-dimensional structure element having a plurality of three-dimensional structural bodies and capable of being uniformly formed without producing a dispersion in shape of the three-dimensional structural bodies, comprising a substrate (11) and the three-dimensional structural bodies (1) disposed in a predetermined effective area (20) on the substrate (11), the three-dimensional structural bodies (1) further comprising space parts formed in the clearances thereof from the substrate (11) by removing sacrificing layers, the substrate (11) further comprising a dummy area (21) having dummy structural bodies (33) so as to surround the effective area (20), the dummy structural body (33) further comprising space parts formed in the clearances thereof from the substrate (11) by removing the sacrificing layers, whereby since the dummy area (21) is heated merely to approx. the same temperature as the effective area (20) in an ashing process for removing the sacrificing layers to prevent a temperature distribution from occurring in the effective area (20).

13 Claims, 10 Drawing Sheets

SECTIONAL VIEW ALONG A-A

U.S. PATENT DOCUMENTS

| | | |
|---|---|---|
| 6,828,557 B2 | 12/2004 | Ishizuya et al. |
| 6,835,932 B2 * | 12/2004 | Ishizuya et al. ......... 250/338.1 |
| 6,969,635 B2 * | 11/2005 | Patel et al. ................. 438/107 |
| 2001/0052570 A1 | 12/2001 | Ishizuya et al. |
| 2002/0027487 A1 * | 3/2002 | Suzuki ....................... 333/262 |
| 2002/0030566 A1 * | 3/2002 | Bozler et al. ............... 333/246 |
| 2004/0114259 A1 | 6/2004 | Ishizuya et al. |
| 2004/0125432 A1 | 7/2004 | Ishizuya et al. |
| 2004/0183395 A1 | 9/2004 | Akagawa et al. |
| 2005/0018955 A1 | 1/2005 | Akagawa et al. |

FOREIGN PATENT DOCUMENTS

| | | | |
|---|---|---|---|
| JP | 08-195387 | * | 7/1996 |
| JP | 11-160635 | | 6/1999 |
| JP | 11202314 | | 7/1999 |
| JP | 2000-077681 | | 3/2000 |
| JP | 2000-077729 | | 3/2000 |
| JP | 2001-013426 | | 1/2001 |
| JP | 2001-129798 | | 5/2001 |

* cited by examiner

SECTIONAL VIEW ALONG A-A

THREE-DIMENSIONAL STRUCTURE ELEMENT AND METHOD OF MANUFACTURING THE ELEMENT, OPTICAL SWITCH, AND MICRO DEVICE

PRIORITY STATEMENT

This application claims the benefit of PCT Application No. PCT/JP03/09734 filed on Jul. 31, 2003, which is incorporated herein by reference in its entirety.

BACKGROUND OF THE INVENTION

The present invention relates to an element having a three-dimensional structure that is formed accurately on a substrate such as a silicon wafer using a sacrificial layer and a method of manufacturing the element. In particular, the invention relates to an optical switch that is formed using a sacrificial layer and a method of manufacturing the optical switch.

In recent years, a method of forming a sacrificial layer on a substrate such as a silicon wafer, forming a thin film structure patterned in a desired shaped on the sacrificial layer, and thereafter forming a desired three-dimensional structure by removing the sacrificial layer has been attracting attention. Since it is possible to form a large number of fine three-dimensional structures accurately and at a high density with this method, the method is suitable for manufacturing a spatial light modulation element and the like.

As a method of removing the sacrificial layer present between the substrate and the thin film structure in such a method of manufacturing a three-dimensional structure using a sacrificial layer, Japanese Patent Laid-open Publication No. 2001-13426 and Japanese Patent Laid-open Publication No. 2001-129798 disclose use of a solution for wet etching such as a hydrofluoric acid water solution. However, in the solution for etching like the hydrofluoric acid water solution that uses water as a solvent, a phenomenon in which water molecules adhere to the thin film structure at the time of etching and the thin film structure adheres to the substrate due to a surface tension of the water molecules tends to occur. When the fine thin film structure adheres to the substrate once, it is not easy to peel off the thin film structure. Thus, the thin film structure may keep adhering to the substrate after drying, making it impossible to obtain a desired three-dimensional shape. In particular, when a thin film structure of a three-dimensional shape including a movable portion is formed, if the thin film structure adheres to a substrate, a function of the movable portion cannot be performed.

On the other hand, as another method of removing a sacrificial layer, a method of removing a sacrificial layer with a dry process such as ashing has been proposed. For example, when the ashing is used, it is known that an organic resist film is used as the sacrificial layer.

SUMMARY OF THE INVENTION

According to the method of removing a sacrificial layer using the dry process such as the ashing, since water molecules do not adhere to the thin film structure and the substrate, it is possible to prevent the thin film structure from sticking to the substrate. However, according to experiments performed by the inventors, it has been found that, in the removal method using the ashing, a large temperature difference occurs in an area where the sacrificial layer is sandwiched between the thin film structure and the substrate and an area where only the sacrificial layer is exposed on the substrate even if the areas are on the same substrate. More specifically, whereas temperature reaches as high as several hundred degrees at the time of the ashing in the area where only the sacrificial layer is exposed on the substrate, temperature does not rise to such high temperature in the area where the sacrificial layer is sandwiched between the thin film structure and the substrate.

It is surmised that such a large temperature distribution occurs because of a distribution of reaction rates. In the portion where the sacrificial layer is sandwiched between the thin film structure and the substrate, since a gas supplied at the time of the ashing reacts with the sacrificial layer while invading between the substrate and the thin film structure, the reaction proceeds slowly. On the other hand, in the portion where only the sacrificial layer is placed on the substrate, a reaction rate is high because the gas reacts with the sacrificial layer while coming into contact with the sacrificial layer from an entire upper surface thereof without stopping, and heat of reaction is generated rapidly. In the portion where only the sacrificial layer is placed on the substrate, since temperature reaches several hundred degrees at the time of the ashing, the temperature may be higher than substrate temperature at the time of formation of the thin film structure and heat treatment temperature. On the other hand, in the portion where the sacrificial layer is sandwiched between the thin film structure and the substrate, temperature does not rise to such high temperature.

Consequently, for example, in the case of an element in which plural thin film structures are arranged precisely in a part of an effective area on the substrate and the substrate is exposed in a peripheral area of the part, high heat generated at the time of the ashing of the peripheral area is conducted to a peripheral portion of the effective area to bring the peripheral portion into a state of being subjected to high heat treatment. Consequently, in the effective area, there is a problem in that a difference occurs in a residual stress of the thin film between the thin film structure in the peripheral edge and the thin film structure in the center and fluctuation occurs in a shape of the thin film structure or fluctuation occurs in an amount of distortion of the thin film structure that utilizes distortion by the residual stress. When the fluctuation occurs in the amount of distortion, a drive unit for displacing the thin film structure is required to change a drive signal for each amount of distortion, which complicates a control system.

It is an object of the present invention to provide a three-dimensional structure element including plural three-dimensional structures, in a configuration that the three-dimensional structures can be formed uniformly without causing fluctuation in a shape of the three-dimensional structures.

In order to attain the object, according to the present invention, a three-dimensional structure element as described below is provided.

In short, the present invention provides a three-dimensional structure element including: a substrate; and three-dimensional structures arranged in a predetermined effective area on the substrate, wherein the three-dimensional structures have space portions, which are formed by removing a sacrificial layer, between the three-dimensional structures and the substrate, and on the substrate, a dummy area is arranged to surround the effective area, dummy structures are arranged in the dummy area, and the dummy structures have space portions, which are formed by removing a sacrificial layer, between the dummy structures and the substrate.

In the three-dimensional structure element, it is possible to form a portion of the dummy structures opposed to the substrate in the same shape as the three-dimensional structures.

In the three-dimensional structure element, it is possible to form the dummy structures in a configuration having columns for fixing at least one section thereof to the substrate.

In the three-dimensional structure element, it is possible to form the dummy structures in a configuration having a thin film covering the dummy area and plural columns arranged between the thin film and the substrate.

In addition, according to the present invention, an optical switch as described below is provided.

In short, the present invention provides an optical switch including: an optical waveguide substrate; and a three-dimensional element substrate including displaceable reflecting mirrors, wherein the three-dimensional structure element substrate has a substrate and three-dimensional structures arranged in a predetermined effective area on the substrate, the three-dimensional structures have the reflecting mirrors and displacement portions on which the reflecting mirrors are placed, and the displacement portions have space portions, which are formed by removing a sacrificial layer, between the displacement portions and the substrate, and on the substrate, a dummy area is arranged to surround the effective area, dummy structures are arranged in the dummy area, and the dummy structures have space portions, which are formed by removing a sacrificial layer, between the dummy structures and the substrate.

Further, according to the present invention, a micro device as described below is provided.

In short, the present invention provides a micro device including displaceable thin film three-dimensional structures, characterized in that the micro device has a substrate and the thin film three-dimensional structures arranged in a predetermined effective area on the substrate, the thin film three-dimensional structures have space portions, which are formed by removing a sacrificial layer, between the thin film three-dimensional structures and the substrate, and on the substrate, a dummy area is arranged to surround the effective area, dummy structures made of a thin film are arranged in the dummy area, and the dummy structures have space portions, which are formed by removing a sacrificial layer, between the dummy structures and the substrate.

Moreover, according to the present invention, a method of manufacturing a three-dimensional structure element as described below is provided.

In short, the present invention provides a method of manufacturing a three-dimensional structure element including:

a step of forming a sacrificial layer and predetermined thin film three-dimensional structures in a predetermined effective area on a substrate and forming a sacrificial layer and predetermined thin film dummy structures in a dummy area surrounding the effective area; and a step of removing the sacrificial layers in the effective area and the dummy area with a dry process.

DETAILED DESCRIPTION OF THE PREFERRED EMBODIMENTS

An embodiment of the present invention will be explained with reference to the accompanying drawings.

Figure 1:
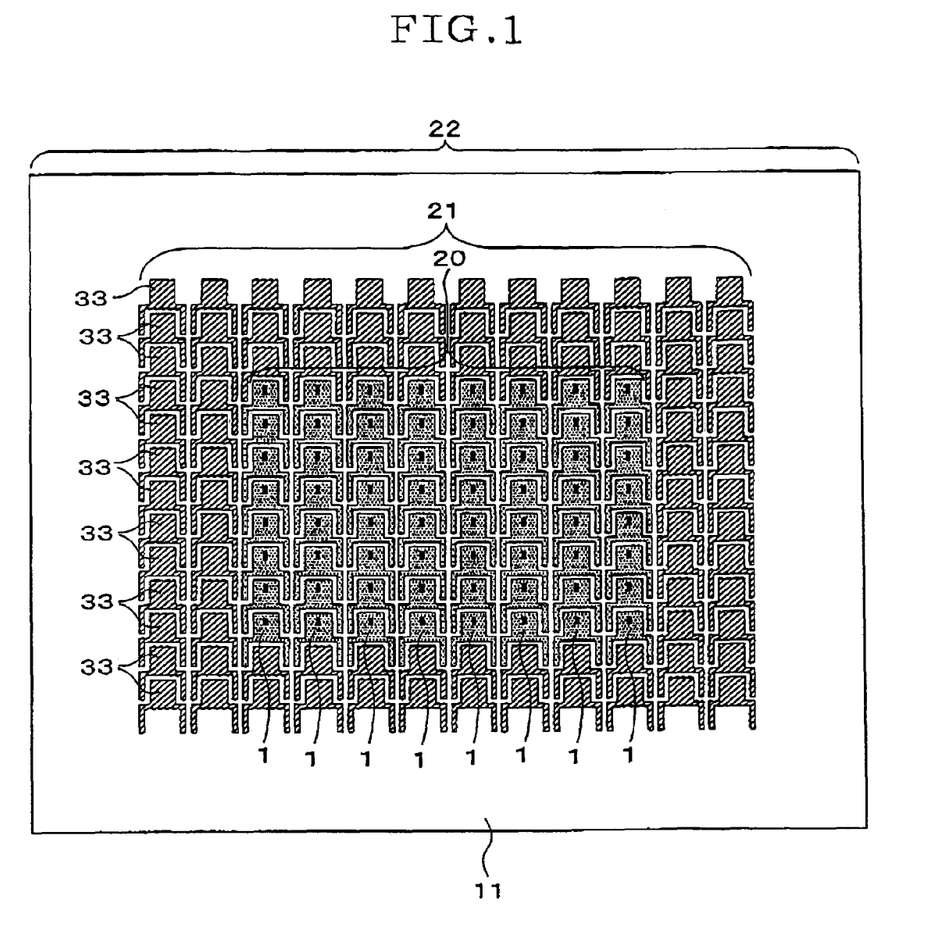
FIG. 1 is an explanatory diagram showing a shape of an upper surface of a three-dimensional structure element including an effective area 20, a dummy area 21, an ineffective area 22 according to an embodiment of the invention.

A three-dimensional structure element according to this embodiment includes a substrate 11, an effective area 20 provided in the center of the substrate 11, a dummy area 21 surrounding the effective area 20, and an ineffective area 22 around the dummy area 21.

Figure 2:
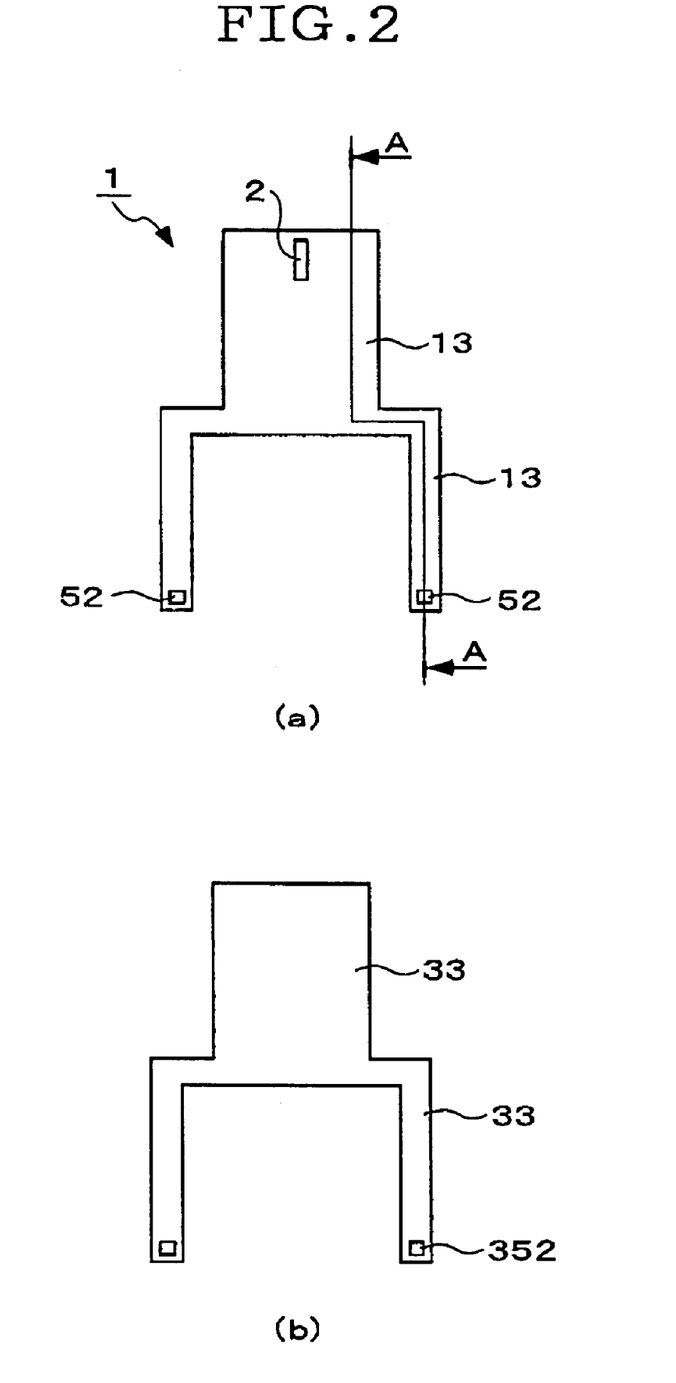
FIG. 2(a) is a plan view showing a shape of an upper surface of a three-dimensional structure 1 arranged in the effective area 20 of the three-dimensional structure element in FIG. 1.
FIG. 2(b) is a plan view showing a shape of an upper surface of a dummy structure 33 arranged in the dummy area 21 of the three-dimensional structure element in FIG. 1.
Figure 3:
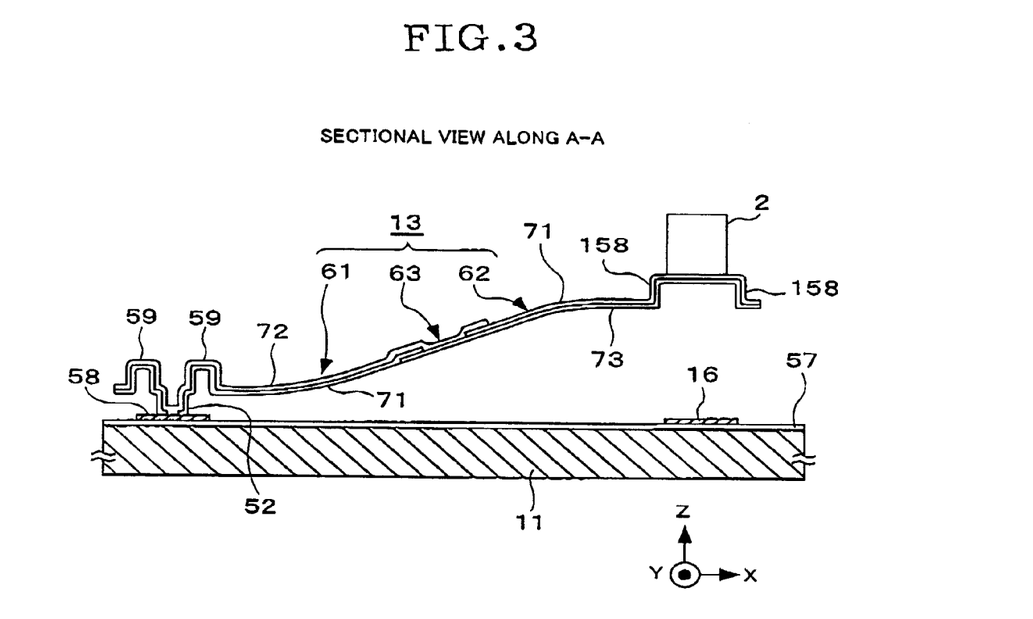
FIG. 3 is a sectional view along line A-A of the three-dimensional structure element in FIG. 2(a)

In the effective area 20, plural three-dimensional structures 1 are arranged, that is, sixteen three-dimensional structures 1 are arranged vertically and horizontally, respectively (16×16 three-dimensional structures 1) (in FIG. 1, for convenience of illustration, eight three-dimensional structures 1 are arranged vertically and horizontally, respectively). As shown in FIG. 2(a) in a plan view and as shown in FIG. 3 in a sectional view, the three-dimensional structure 1 has a displacement portion 13 of a cantilever shape and a reflecting mirror 2 placed at one end of the displacement portion 13. The displacement portion 13 has a configuration in which two thin films of different materials are stacked and has two legs 52 at ends on the opposite side of an end where the reflecting mirror 2 is placed. The two legs 52 are fixed to the substrate 11. In a state in which no force is applied from the outside, the displacement portion 13 is bent as shown in FIG. 3 by an internal stress of the thin films forming the displacement portion 13 to come into a state in which the displacement portion 13 lifts the reflecting mirror 2 to a position apart from the substrate 11. In addition, a not-shown wiring pattern layer is formed in the displacement portion 13. On the substrate 11, a wiring pattern layer 58 is arranged in a position, where the legs 52 of the displacement portion 13 are in contact with the substrate 11, and electrically connected to the wiring pattern layer of the displacement portion 13 to feed an electric current to the wiring pattern layer of the displacement portion 13. On the other hand, in a portion on the substrate 11 and below the reflecting mirror 2, a wiring pattern layer 16 for generating a magnetic field is arranged. With such a configuration, an electric current is fed to the wiring pattern layer of the displacement portion 13 and an electric current is fed to the wiring pattern layer 16 to generate a magnetic field, whereby it is possible to draw the displacement portion 13 toward the substrate 11 with the Lorentz force and lower the reflecting mirror 2 to the position of the substrate 11.

As shown in FIG. 1, plural dummy structures 33 are arranged in the dummy area 21 on the substrate 11. These dummy structures 33 are arranged to prevent the dummy area 21 from being heated to high temperature in a process of removing a sacrificial layer in a manufacturing method to be described later. The dummy structures 33 are formed in the same shape as the displacement portions 13 of the three-dimensional structures 1 and have legs 352 that are the same as the legs 52 of the displacement portions 13. In addition, the dummy structures 33 are arranged vertically and horizontally at the same pitch as the three-dimensional structures 1 in the effective area 20. However, the reflecting mirrors 2 and the wiring pattern layers are not formed in the dummy structures 33 in order to simplify a configuration thereof. Note that, in FIG. 1, in order to make it easy to distinguish the three-dimensional structures 1 from the dummy structures 33, dot patterns and hatchings are added, respectively, in the figure for convenience. FIG. 1 shows shapes of upper surfaces of the three-dimensional structures 1 and the dummy structures 33.

On the other hand, the three-dimensional structures 1 and the dummy structures 33 are not arranged in the ineffective area 22 on the substrate 11. Although not shown in the figure, wiring pattern layers 58 and 16 are arranged for drawing around wiring.

Next, a method of manufacturing a three-dimensional structure element according to this embodiment will be explained with reference to FIGS. 6A to 6G.

In this embodiment, a wafer-like silicon substrate is used as the substrate 11, a large number of the three-dimensional structure elements in FIG. 1 are arranged two-dimensionally, and finally cut out to complete the three-dimensional structure elements. In FIGS. 6A to 6G to be referred to in the following explanation, only a sectional part of one three-dimensional structure 1 of one three-dimensional structure element is shown. However, treatments such as the film formation, the photolithography, and the etching are applied to the entire wafer-like substrate 11.

Figure 6:
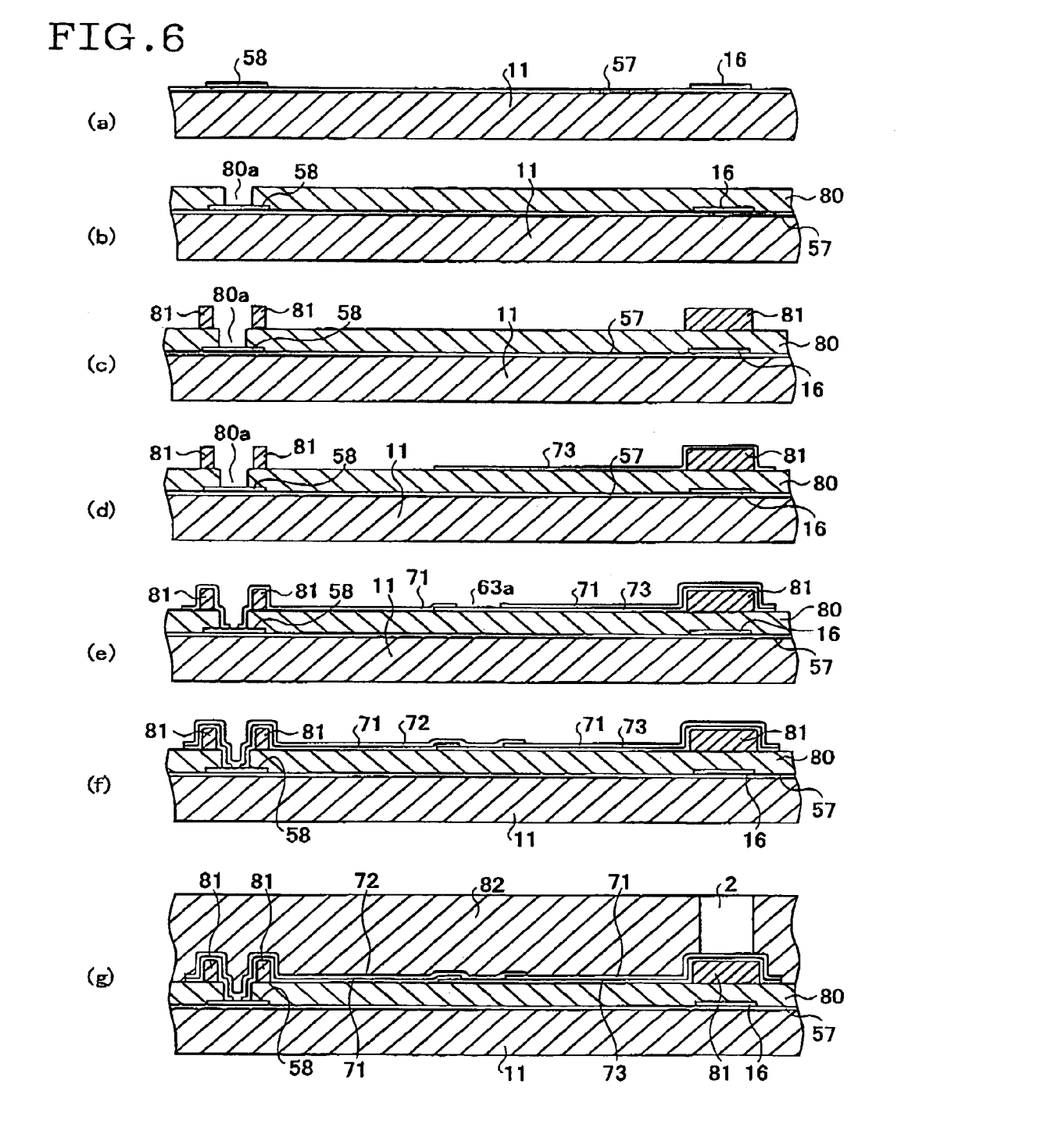
FIGS. 6(a) to 6(g) are sectional views explaining a process of manufacturing the three-dimensional structure element in FIG. 1.

First, a silicon oxide film 57 is formed over an entire upper surface of the wafer-like substrate 11 by a thermal oxidation method, an Al film to be the wiring pattern layer 58 and the wiring pattern layer 16 is formed on the silicon oxide film 57, and by the photolithography and etching, the Al film is patterned into respective shapes of the wiring pattern layer 58 and the wiring pattern layer 16 (FIG. 6A). A resist layer to be a sacrificial layer 80 is formed over the entire upper surface of the wafer-like substrate 11 in this state by application and baking, and an opening 80a is formed in a position to be the legs 52 by the photolithography and the etching (FIG. 6(b)).

Next, a resist layer 81 to be a sacrificial layer is formed over the entire surface of the wafer-like substrate 11 in the state shown in FIG. 6(b) by application and baking, and the resist layer 81 is left in a predetermined shape, for example, an island shape around the positions of the legs 52 and in a position where the reflecting mirror 2 is placed, by the photolithography and the etching (FIG. 6(c)). This left sacrificial layer 81 is arranged in order to form steps 59 and 158 in the displacement portion 13 as shown in FIG. 3. It is possible to increase strength of the displacement portion 13 by forming the steps 59 and 158.

Next, according to steps of FIGS. 6D to 6F, the displacement portions 13 and the legs 52 are formed in the effective area 20 using an Al film 73, an SiN film 71, and an Al film 72 and the dummy structures 33 having the same structure as the displacement portion 13 are formed in the dummy area 21. In this embodiment, as shown in FIG. 3, the displacement portion 13 is formed to be made up of three portions, namely, a base 61 warped upward, a tip portion 62 warped downward, and a connecting portion 63 connecting the base 61 and the tip portion 62. The directions of the warps of the base 61 and the tip portion 62 are set to be opposite in this way, whereby, even if a distance from the leg 52 to the tip of the displacement portion 13 is long, it is possible to reduce a space between the tip and the substrate 11. Consequently, it is possible to switch a position where the reflecting mirror 2 is lifted to a position where the reflecting mirror 2 is drawn toward the substrate 11, by a small Lorentz force. In order to realize the upward warp with internal stresses of the films, the base 61 has a configuration in which the SiN film 71 and the Al film 72 are stacked from the base 11 side. Conversely, in order to realize the downward warp, the tip portion 62 has a configuration in which the Al film 73 and the SiN film 71 are stacked from the base 11 side. The connecting portion 63 is constituted such that these films overlap partially. The legs 52 are formed integrally with the base 61. Note that, when the Al films 73 and 72 and the SiN film 71 are formed, the substrate 11 is heated to a predetermined temperature in order to control internal stresses of the respective films.

A specific procedure will be explained. First, after an Al film to be the Al film 73 of the tip portion 62 is formed over the entire wafer-like substrate 11 with vapor deposition, sputtering, or the like, the Al film is patterned by the photolithography and the etching to have respective shapes of the tip portion 62 and the connecting portion 63 of the displacement portion 13 in the effective area 13 and the dummy structure 33 in the dummy area 21 (FIG. 6(d)). Next, after an SiN film to be the SiN film 71 of the base 61 and the tip portion 62 is formed over the entire wafer-like substrate 11 with the plasma CVD or the like, the SiN film is patterned by the photolithography and the etching to have shapes of the base 61, the legs 52, and the tip portion 62 of the displacement portion 13 and the dummy structure 33 (FIG. 6(e)). At this point, an opening is provided in the SiN film 71 in a position of a bottom of the opening 80a to be the legs 52. Consequently, the Al film 72 and the wiring pattern layer 58 to be formed next are connected. Further, after an Al film to be the Al film 72 of the base 61 is formed over the entire wafer-like substrate 11, the Al film is patterned to have shapes of the base 61, the legs 52, and the connecting portion 63 of the displacement portion 13 and the dummy structure 33 (FIG. 6(f)). With the procedure described above, the displacement portion 13 and the legs 52 having a shape, in which the Al film 72 of the base 61 and the Al film 73 of the tip portion 62 overlap in the connecting portion 63, are formed.

Next, after a resist layer to be the sacrificial layer 82 is applied thick over the entire wafer-like substrate 11 and baked, an opening of a shape of the reflecting mirror 2 is formed by exposure and development in a position where the reflecting mirror 2 should be formed. Thereafter, Au, Ni, or another metal is grown by electrolytic plating to fill the opening. Consequently, the reflecting mirror 2 is formed.

With the process described above, in the respective three-dimensional structure elements of the wafer-like substrate 11, as shown in FIG. 6(g), the portions of the effective areas 20 and the dummy area 21 have a structure in which the displacement portion 13 and the dummy structure 33 are sandwiched between the sacrifice layer 80 and the sacrifice layer 82. On the other hand, the portion of the ineffective area 22 has a structure in which the sacrificial layer 80 and the sacrificial layer 82 are stacked directly.

In this state, groove-like slits are formed in boundaries of the respective three-dimensional structure elements of the wafer-like substrate 11 by dicing or the like. The slits do not completely cut the substrate 11 but is formed in a shape of a groove. Thus, the substrate 11 maintains the wafer shape.

Next, the sacrificial layer 80, the sacrificial layer 82, and the sacrificial layer 81 are removed by plasma ashing. Consequently, the displacement portion 13 in the effective area 20 and the dummy structure 33 in the dummy area 21 stand from the substrate 11 to form a three-dimensional structure as shown in FIG. 3.

Figure 7:
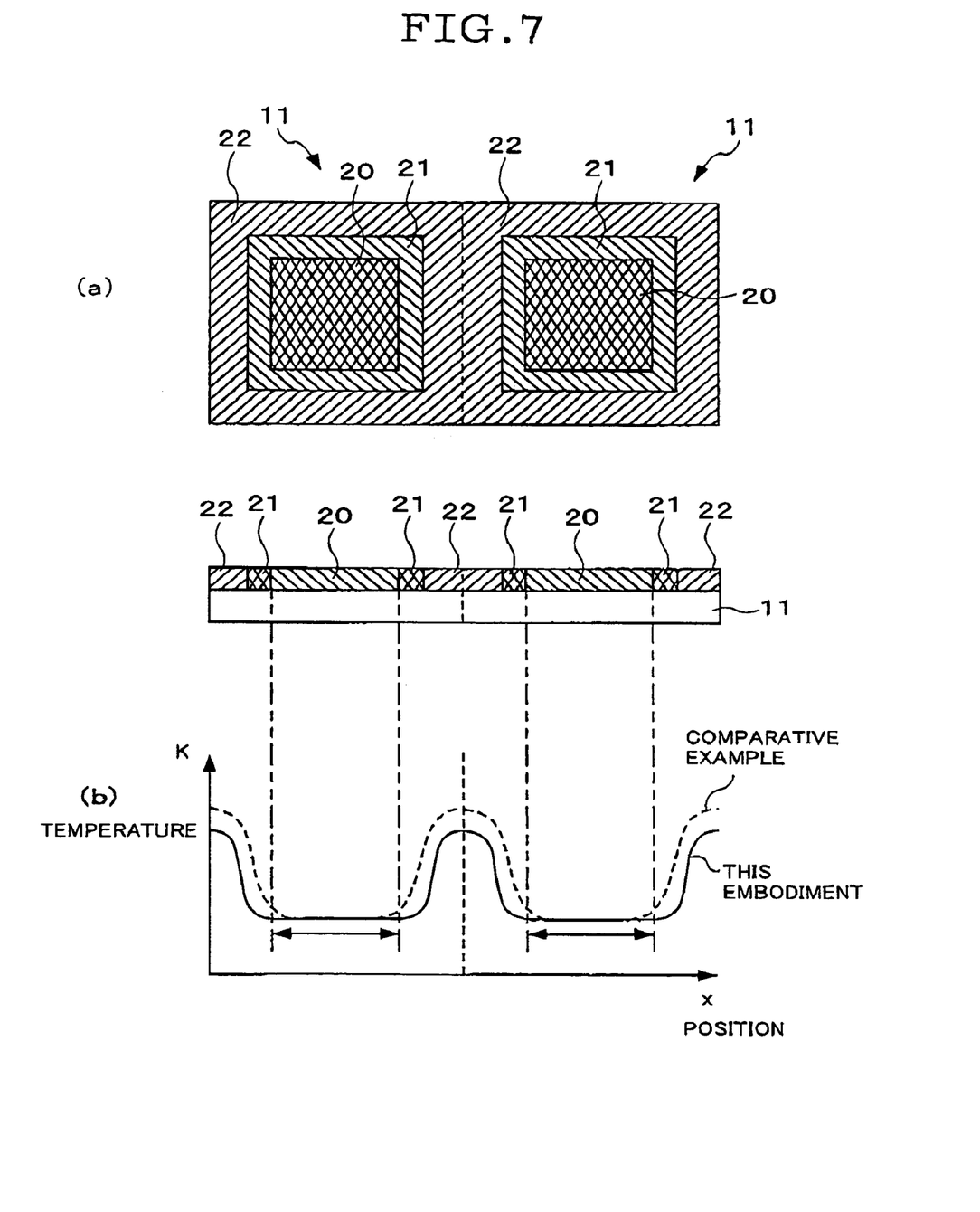
FIG. 7(a) is an explanatory diagram showing a shape of an upper surface in a state in which two three-dimensional structure elements in FIG. 1 are continuously formed.
FIG. 7(b) is an explanatory diagram showing a sectional shape and a temperature distribution of respective portions in an ashing process in the state in which two three-dimensional structure elements in FIG. 1 are continuously formed.

In a plasma ashing process, heat of reaction is generated by a reaction of the sacrificial layers 80 and 82 and the sacrificial layer 81 and the plasma. In particular, in the ineffective area 22, since the sacrificial layer 80 and the sacrificial layer 82 overlap directly, the reaction with the plasma quickly develops from the entire upper surface to the substrate 11. Thus, an ashing rate is high. Consequently, heat of reaction is generated suddenly in the ineffective area 22, and temperature of the ineffective area 22 rises. On the other hand, in the effective area 20 and the dummy area 21, since the displacement portion 13 and the dummy structure 33 are sandwiched between the sacrificial layer 80 and the sacrificial layer 82, after the sacrificial layer 82 on the upper side is removed by the reaction with the plasma, the plasma reacts with the sacrificial layers 80 and 81 while gradually invading from gaps of the displacement portion 13 and the dummy structure 33. Thus, a reaction rate of the effective area 20 and the dummy area 21 is low compared with that of the ineffective area 22, and temperature of the effective area 20 and the dummy area 21 does not rise to high temperature like that of the ineffective area 22. When the inventors performed an experiment to check a temperature distribution of a substrate, as shown in FIG. 7(b), temperature of the ineffective area 22 rose to high temperature of several hundred degrees, which was higher than a substrate temperature at the time of formation of the Al films 73 and 72 and the SiN film 71 constituting the displacement portion 13. On the other hand, temperature of the effective area 20 and the dummy area 21 was lower than the substrate temperature at the time of formation of the films.

Since heat of the high-temperature ineffective area 22 was conducted to a portion where the dummy area 21 was in contact with the ineffective area 22, a temperature distribution in the dummy area 21 occurred. However, since the heat of the ineffective area 22 was not conducted to the effective area 20, the temperature distribution was uniform. In this way, by providing the dummy area 21 and preventing temperature rise in the dummy area 21, it is possible to prevent high heat generated in the ineffective area 22 from being conducted to the effective area 20. Consequently, in the ashing process, since temperature of the Al films 73 and 72 and the SiN film 71 constituting the displacement portion 13 in the effective area 20 does not rise to temperature higher than that at the time of formation of the films uniformly, an internal stress of the 16×16 displacement portions 13 in the effective area 20 is kept in a state to be controlled by the substrate temperature at the time of formation of the films. Thus, shapes of warp of the 16×16 displacement portions 13 do not fluctuate, and it is possible to form all the displacement portions 13 in a predetermined three-dimensional structure. Note that, in this embodiment, a width of the dummy area 21 is kept at a width of about 500 μm. By giving a width of this level to the dummy area 21, heat generated in the ineffective area 22 is prevented from being conducted to the effective area 20 significantly.

Finally, by dividing the wafer-like substrate 11 in positions of the grooves in the boundaries of the three-dimensional structure elements, individual three-dimensional structure elements can be completed. Note that it is also possible to adopt a procedure for cutting off the substrate 11 for each of the three-dimensional structure elements with the dicing before the ashing process and apply the ashing process to the individual three-dimensional structure elements.

Note that, in the case of the configuration in FIG. 1 of this embodiment, since a part of the ineffective area 22 is allocated to the dummy area 21, it is possible to reduce an area in which heat generation is large at the time of the ashing. Compared with the case in which dummy area 21 is not provided, a difference in temperature between a portion of high temperature and a portion of low temperature on a wafer is reduced. Thus, heat generated in the ineffective area 22 become less likely to be conducted to the effective area 20, which makes it easy to manufacture the three-dimensional structures 1 with a uniform shape on the entire surface of the effective area.

Figure 10:
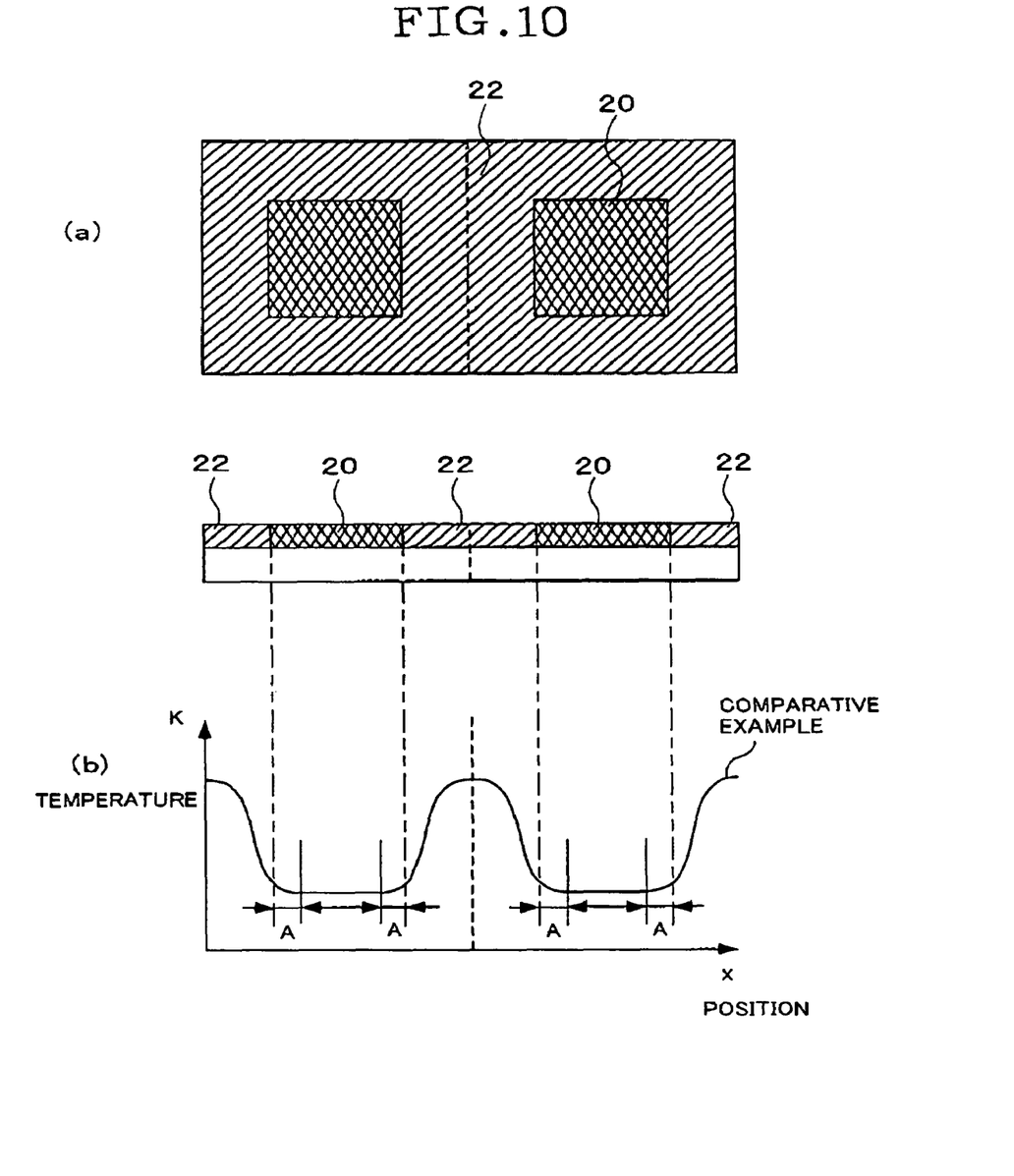
FIG. 10(a) is an explanatory diagram showing a shape of an upper surface in a state in which two three-dimensional structure elements not including dummy areas are continuously formed as a comparative example.
FIG. 10(b) is an explanatory diagram showing a sectional shape in a state in which two three-dimensional structure elements of the comparative example are continuously formed and a temperature distribution of respective portions in an ashing process.

As a comparative example, when a three-dimensional structure element of a structure not including the dummy area 21 was created as shown in FIG. 10(a) to check a temperature distribution at the time of the ashing, the result was as shown in FIG. 10(b). In the case of the configuration of the comparative example shown in FIG. 10(a), since an area of the ineffective area 22 is large, temperature of the ineffective area 22 is higher than the temperature of the ineffective area 22 in this embodiment as shown in FIGS. 7B and 10B. In addition, in the case of the comparative example, since the ineffective area 22 and the effective area 20 are in direct contact with each other, heat of the ineffective area 22 is conducted to an outer peripheral portion (an area A in FIG. 10(*b*)) of the effective area 20 to cause a temperature distribution in the effective area 20. Consequently, the area A of the effective area 20 is heated to temperature higher than the substrate temperature at the time of formation of the films, and internal stresses of the films constituting the displacement portion 13 change. Thus, fluctuation occurs in three-dimensional shapes of the 16×16 displacement portions 13 of the effective area 20. Therefore, even in the effective area 20, shapes of the displacement portions 13 become different depending on a place, and it is impossible to form the three-dimensional structures 1 having the same shape over the entire surface in the effective area 20.

Note that the method of removing a sacrificial layer is not limited to the plasma ashing, and it is also possible to use ion ashing, dry etching, and the like. In this case, it is also possible to prevent heat of reaction of an ineffective area from being conducted to an effective area by providing a dummy area in a boundary of the effective area and the ineffective area.

Figure 4:
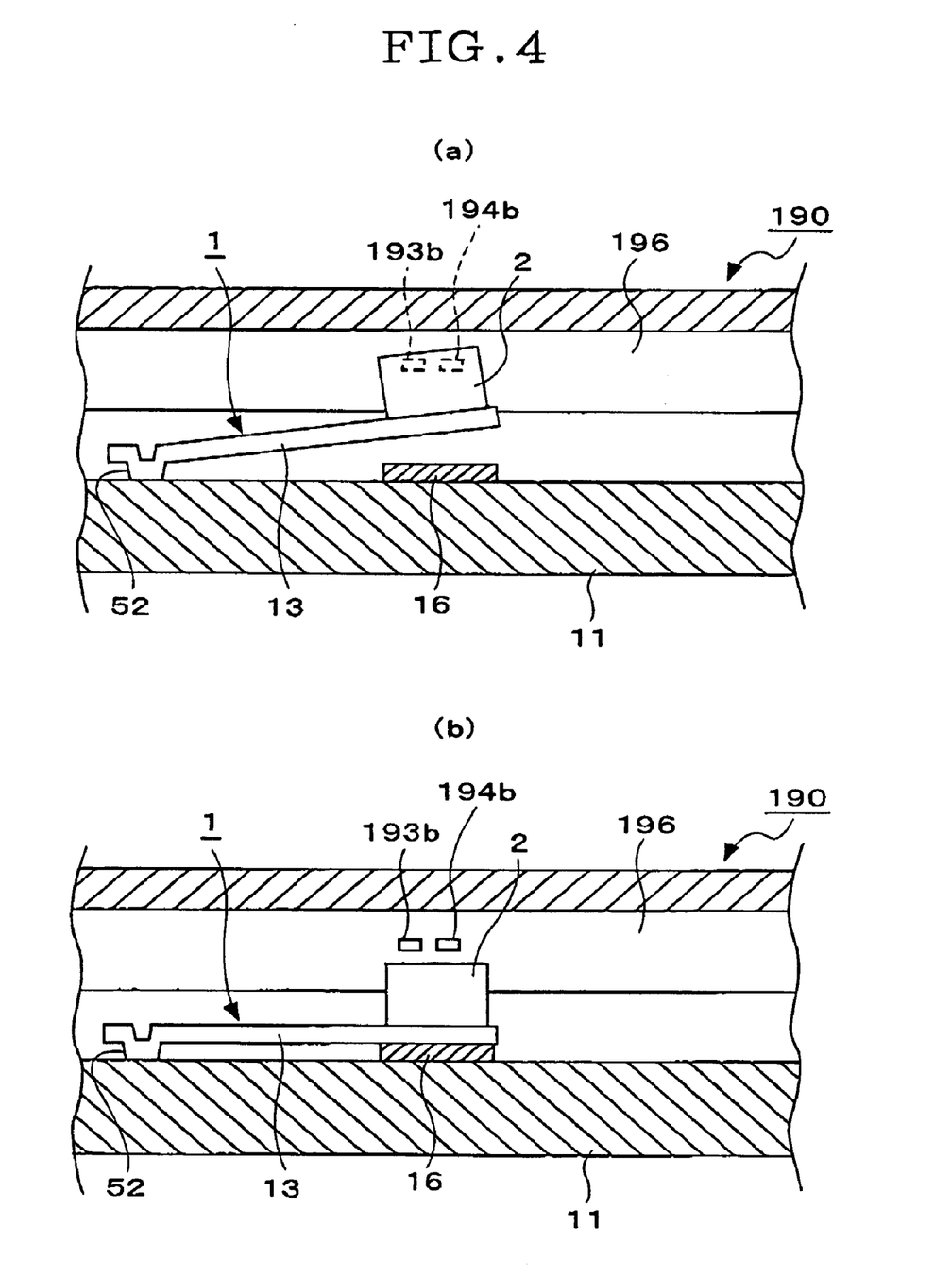
FIG. 4(a) is a sectional view showing a shape of an optical switch that is constituted by superimposing the three-dimensional structure element in FIG. 1 and an optical waveguide substrate 190.
FIG. 4(b) is a sectional view showing a shape of an optical switch in a state in which a reflecting mirror 2 of the three-dimensional structure 1 is lowered by a Lorentz force in the optical switch constituted by superimposing the three-dimensional structure in FIG. 1 and the optical waveguide substrate 190.
Figure 5:
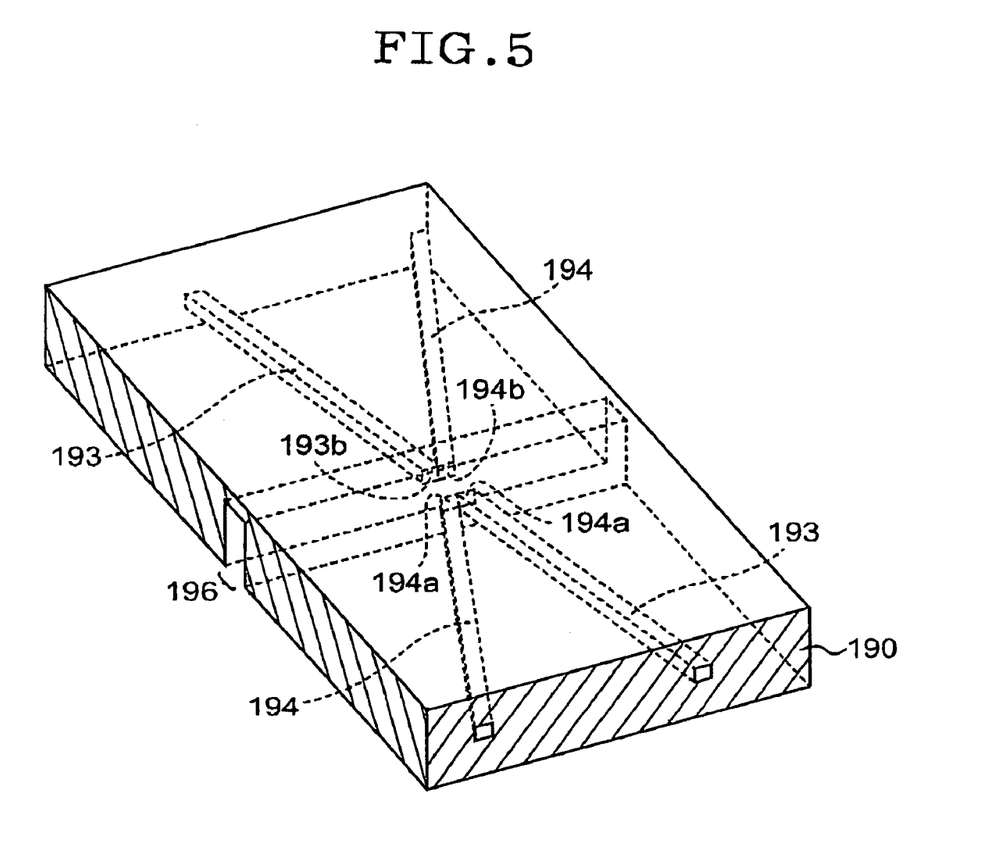
FIG. 5 is a perspective view showing a shape of a part of the optical waveguide substrate 190 of the optical switch in FIG. 4.

It is possible to form an optical switch by superimposing the three-dimensional structure element of this embodiment on an optical waveguide substrate 190 in which plural optical waveguides such as optical waveguides 193 and 194 are formed as shown in FIG. 5. Although only a part of the optical waveguide substrate 190 is shown in FIG. 5, a large number of optical waveguides such as the optical waveguides 193 and 194 are arranged in the optical waveguide substrate 190 to cross in a diamond lattice shape at fixed intervals, and a groove 196 is formed to traverse a point where the optical waveguides intersect. A pitch of the 16×16 three-dimensional structures 1 arranged on the substrate is defined to coincide with the intervals of the points where the optical waveguides of the optical waveguide substrate 190 intersect. Thus, by arranging and superimposing the three-dimensional structure element and the optical waveguide substrate 190, it is possible to insert each of the reflecting mirrors 2 of the three-dimensional structures 1 in the groove 196 in the position where the optical waveguides of the optical waveguide substrate 190 intersect as shown in FIG. 4(*a*). Consequently, for example, in the case of the configuration in FIG. 5, light propagated through the optical waveguide 193 can be emitted from a facet 193*b*, reflected on the reflecting mirror 2, and made incident on a facet 194*b* of the optical waveguide 194. On the other hand, by lowering the displacement portion 13 of the three-dimensional structure 1 with the Lorentz force as shown in FIG. 4(*b*), it is possible to remove the reflecting mirror 2 from the groove 196 and, for example, advance straight the light propagated through the optical waveguide 193 directly. In this way, by controlling an electric current fed to the wiring pattern layers 58 and 16, it is possible to realize an optical switch that switches a traveling direction of light with the reflecting mirror 2.

Incidentally, in the embodiment described above, the dummy structure 33 is formed in the stacked structure of the Al films 73 and 72 and the SiN film 71 in the same manner as the displacement portion 13. However, since the dummy structure 33 only has to set a reaction rate of the dummy area 21 at the time of the ashing to the same level as a reaction rate of the effective area 20, it is possible to constitute the dummy structure 33 with any one of the layers.

Figure 8:
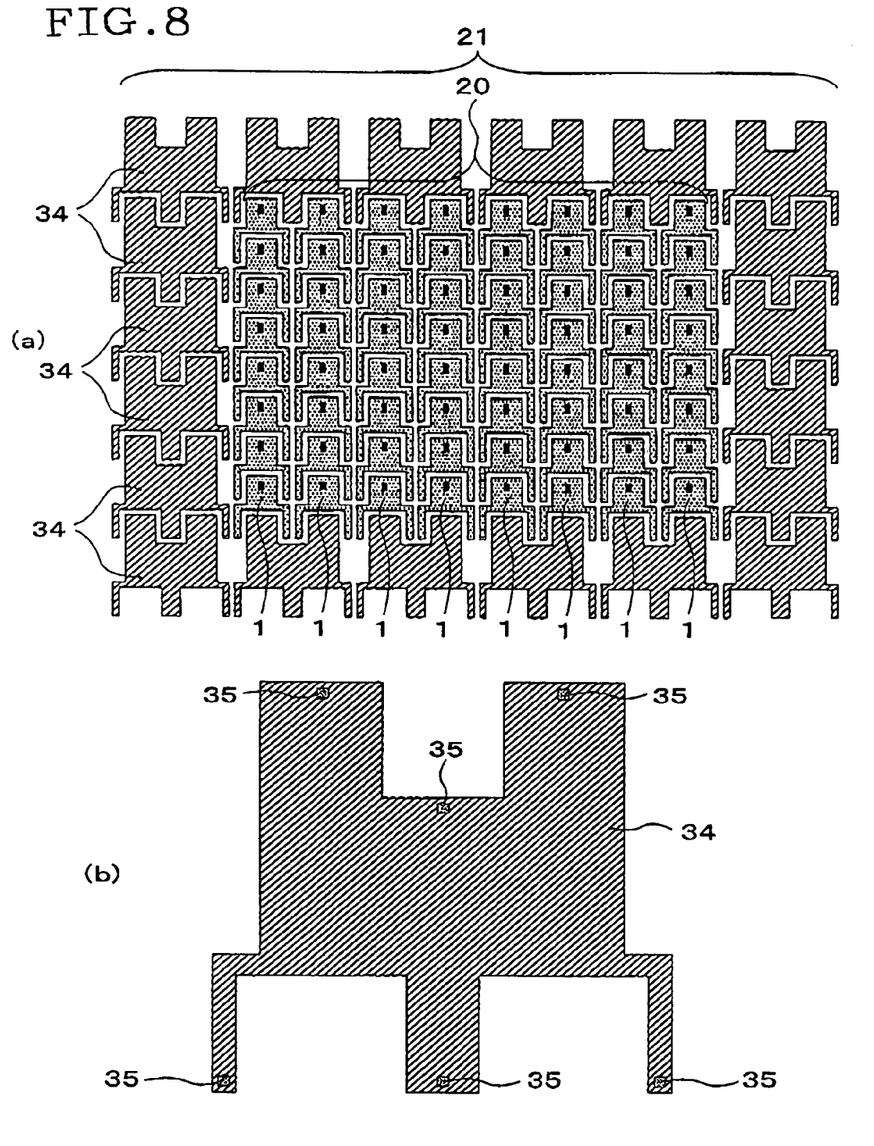
FIG. 8(a) is an explanatory diagram showing a structure of an upper surface of the effective area 20 and the dummy area 21 in a case in which dummy structures 34 of a different shape are used as the dummy structures in a three-dimensional structure element according to the embodiment of the invention.
FIG. 8(b) is an explanatory diagram showing a structure of an upper surface of the dummy structure 34.

A pattern shape of the dummy structure does not have to be the same as that of the displacement portion 13. It is possible to form the dummy structure in a shape in which several displacement portions 13 of the three-dimensional structure 1 are continuously formed as in the dummy structure 34 shown in FIGS. 8A and 8B and form the dummy structure in a size larger than the displacement portion 13. In the example of FIG. 8, in order to prevent the dummy structure 34 from sticking to the substrate 11 at the time of the ashing or curling up to make the sacrificial layer 80 on the substrate 11 side easily subjected to the ashing, columns 35 for fixing the substrate 11 are formed in plural places in the peripheral portion of the dummy structure 34. The columns 35 have the same configuration as the legs 52 of the displacement portion 13 and can be formed integrally with thin films constituting the dummy structure 34. By arranging the dummy structure 34 in this way, as in the dummy structure 33 described above, the dummy structure 34 has an action of substantially equalizing an ashing rate of the dummy area 21 with the ashing rate in the effective area 20. Thus, it is possible to make a temperature distribution in the effective area 20 substantially constant. Note that, in this example, a width of the dummy area is also set to 500 µm.

Figure 9:
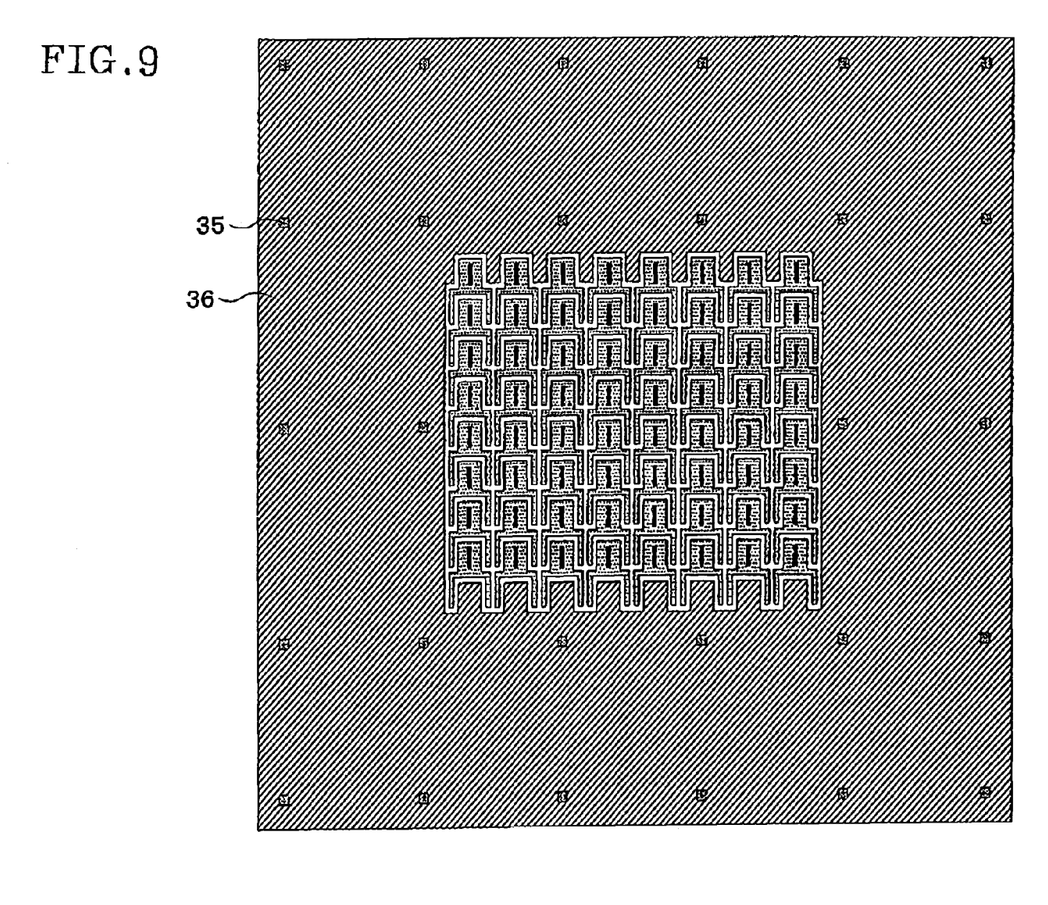
FIG. 9 is an explanatory diagram showing a structure of an upper surface of the effective area 20 and the dummy area 21 in a case in which dummy structures 35 of a different shape are used as the dummy structure in a three-dimensional structure element according to the embodiment of the invention.

An example of still another configuration of a dummy structure will be explained with reference to FIG. 9. In a dummy structure 36 in FIG. 9, the entire dummy area 21 in the peripheral portion of the effective area 20 is covered by one continuous thin film. Consequently, an ashing rate of the dummy area 21 is set smaller than that of the ineffective area 22. In the dummy structure 36 in FIG. 9, the plural columns 35 are also arranged at fixed intervals to prevent the dummy structure 36 from sticking to the substrate 11 at the time of the ashing or curling up to make the sacrificial layer 80 on the substrate 11 side easily subjected to the ashing. Note that, in the example of FIG. 9, a width of the dummy area 22 is set to about 1 mm.

Therefore, in this embodiment, a shape of a dummy structure formed in the dummy area 21 is not limited, and any shape may be adopted as long as the dummy structure can cover the sacrificial layer 80 to thereby set an ashing rate of the dummy area 21 smaller than that of the ineffective area 22. Thus, it is possible to select a shape and a dimension of the dummy area 21 freely.

As described above, according to the present invention, since the dummy area 21 including dummy structures is arranged to be in contact with the outer side of the effective area 20, temperature of the dummy area 21 does nor rise to high temperature compared with the ineffective area 22 even during the ashing process and is not largely different from temperature in the effective area. Thus, in the three-dimensional structure elements 1 in the effective area 20 after completion, there is no distribution in a residual stress, and amounts of distortion of the three-dimensional structure elements 1 after removing a sacrificial layer are uniform. In addition, by constituting an optical switch using such a three-dimensional structure element, it is possible to control plural switching mechanisms with substantially the same control signal.

Note that, in this embodiment, the three-dimensional structure element, in which the 16×16 three-dimensional structures 1 are arranged two-dimensionally in the effective area 20, is described as a three-dimensional structure element. However, in the present invention, the number of three-dimensional structures and an arrangement thereof are not limited to this configuration. For example, the present invention is also effective for a shape in which one three-dimensional structure is arranged for the entire effective area 20.

In addition, as in this embodiment, it is possible to constitute a micro device other than the optical switch, such as an infrared ray sensor or a digital mirror device, using a three-dimensional structure element including a three-dimensional structure of a desired shape.

According to the present invention, it is possible to provide a three-dimensional structure element including plural three-dimensional structures, in a configuration that the three-dimensional structures can be formed uniformly without causing fluctuation in a shape of the three-dimensional structures.

What is claimed is:

1. A three-dimensional structure element comprising:
a substrate; and
three-dimensional structures arranged in a predetermined effective area on the substrate, wherein
the three-dimensional structures have space portions which are formed by removing a sacrificial layer, between the three-dimensional structures and the substrate, and
on the substrate, a dummy area is arranged to surround the effective area, dummy structures are arranged in the dummy area, and the dummy structures have space portions, which are formed by removing a sacrificial layer, between the dummy structures and the substrate.

2. A three-dimensional structure element according to claim 1, wherein a portion of the dummy structures opposed to the substrate is formed in a same shape as the three-dimensional structures.

3. A three-dimensional structure element according to claim 1, wherein the dummy structures have columns for fixing at least one section thereof to the substrate.

4. A three-dimensional structure element according to claim 1, wherein the dummy structures have a thin film covering the dummy area and plural columns arranged between the thin film and the substrate.

5. An optical switch comprising:
an optical waveguide substrate; and
a three-dimensional element substrate including displaceable reflecting mirrors, wherein
the three-dimensional structure element substrate has a substrate and three-dimensional structures arranged in a predetermined effective area on the substrate,
the three-dimensional structures include the reflecting mirrors and displacement portions on which the reflecting mirrors are placed, and the displacement portions have space portions, which are formed by removing a sacrificial layer, between the displacement portions and the substrate, and
on the substrate, a dummy area is provided to surround the effective area, dummy structures are arranged in the dummy area, and the dummy structures have space portions, which are formed by removing a sacrificial layer, between the dummy structures and the substrate.

6. A micro device comprising displaceable thin film three-dimensional structures, wherein the micro device has a substrate and the thin film three-dimensional structures arranged in a predetermined effective area on the substrate,
the thin film three-dimensional structures have space portions, which are formed by removing a sacrificial layer, between the thin film three-dimensional structures and the substrate, and
on the substrate a dummy area is arranged to surround the effective area, dummy structures made of a thin film are arranged in the dummy area, and the dummy structures have space portions, which are formed by removing a sacrificial layer, between the dummy structures and the substrate.

7. A three-dimensional structure element according to claim 1, wherein:
each of the three-dimensional structures in the effective area comprises a respective portion of a wiring pattern layer associated therewith, the respective portions of the wiring pattern layer being configured to operate the respective three-dimensional structures in the effective area; and
the dummy structures are not associated with the wiring pattern layer.

8. A three-dimensional structure element according to claim 1, wherein each of the three-dimensional structures in the effective area and each of the dummy structures comprises a respective displacement portion.

9. A three-dimensional structure element according to claim 8, wherein:
each of the displacement portions comprises at least one respective leg coupled to the substrate; and
each of the displacement portions extends in a cantilever manner from the at least one leg.

10. A three-dimensional structure element according to claim 9, wherein each of the displacement portions in the effective area comprises a respective reflecting mirror situated at an end of the displacement portion.

11. A three-dimensional structure element according to claim 10, wherein each of the displacement portions in the effective area further comprises a respective portion of a wiring pattern layer situated on the substrate below the respective reflecting mirror.

12. A three-dimensional structure element according to claim 9, wherein:
each of the displacement portions comprises two legs coupled to the substrate; and
each of the displacement portions extends in a cantilever manner from the respective legs.

13. A three-dimensional structure element according to claim 1, wherein:
the substrate comprises an ineffective area arranged around the circumference of the substrate;
on the substrate, the dummy area is arranged to surround the effective area, but only adjacent the ineffective area.

* * * * *

UNITED STATES PATENT AND TRADEMARK OFFICE
CERTIFICATE OF CORRECTION

PATENT NO.         : 7,298,015 B2
APPLICATION NO. : 10/523267
DATED              : November 20, 2007
INVENTOR(S)        : Tohru Ishizuya It is certified that error appears in the above-identified patent and that said Letters Patent is hereby corrected as shown below:

In column 1, line 23, the word "shaped" should be --shape--.

In column 5, line 47, the number "352" should be --52--.

In column 6, line 31, the number "158" should be --58--.

In column 8, line 55, the word "become" should be --becomes--.

In column 10, line 49, the phrase "does nor" should be --does not--.

Signed and Sealed this

Eighth Day of July, 2008

JON W. DUDAS
*Director of the United States Patent and Trademark Office*